(12) United States Patent
Seto et al.

(10) Patent No.: US 6,835,635 B2
(45) Date of Patent: Dec. 28, 2004

(54) ELECTRODE FORMING METHOD AND FIELD EFFECT TRANSISTOR

(75) Inventors: Hiroyuki Seto, Yasu-gun (JP); Makoto Inai, Otsu (JP); Hiroyuki Nakano, Yasu-gun (JP); Eiji Tai, Yasu-gun (JP)

(73) Assignee: Murata Manufacturing Co., Ltd. (JP)

( * ) Notice: Subject to any disclaimer, the term of this patent is extended or adjusted under 35 U.S.C. 154(b) by 167 days.

(21) Appl. No.: 10/316,210

(22) Filed: Dec. 10, 2002

(65) Prior Publication Data

US 2003/0129833 A1 Jul. 10, 2003

(30) Foreign Application Priority Data

Jan. 4, 2002 (JP) ........................................ 2002-000061

(51) Int. Cl.⁷ .......................... H01L 21/28; H01L 21/44
(52) U.S. Cl. .................... 438/574; 438/638; 438/642
(58) Field of Search ............................. 438/182, 574, 438/638, 640, 642, 652

(56) References Cited

U.S. PATENT DOCUMENTS

| 4,213,840 A | * | 7/1980 | Omori et al. ................ 438/571 |
| 4,337,115 A | * | 6/1982 | Ikeda et al. ................. 438/670 |
| 5,583,063 A | * | 12/1996 | Samoto ...................... 438/570 |

FOREIGN PATENT DOCUMENTS

| JP | 4-359522 | 12/1992 |
| JP | 60-37239 | 2/1994 |
| JP | 6-168906 | 6/1994 |
| JP | 8-115923 | 5/1996 |

OTHER PUBLICATIONS

JPO Office Action and Translation from Japanese language to English language.

* cited by examiner

Primary Examiner—Ngân V. Ngô
Assistant Examiner—Theresa T. Doan
(74) Attorney, Agent, or Firm—Ostrolenk, Faber, Gerb & Soffen, LLP

(57) ABSTRACT

A gate electrode is formed in the following manner. A first resist layer having a first opening is formed on a semiconductor substrate. A second resist layer having a second opening larger than the first opening is formed on the first resist layer. A first conductor layer containing a high-melting-point metal is formed. Subsequently, a second conductor layer containing low-resistance metal is formed, and then the first conductor layer within the second opening is removed by etching. Next, the second resist layer is removed by a lift-off process, and finally the first resist layer is removed by ashing.

17 Claims, 4 Drawing Sheets

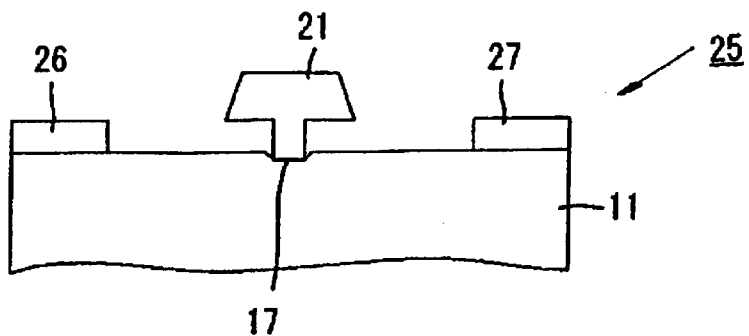
FIG. 2
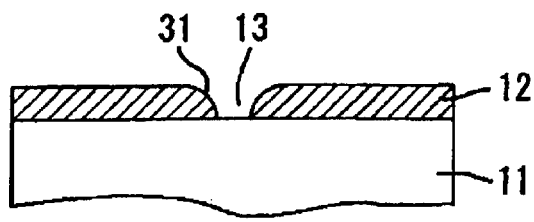
FIG. 3A (1)
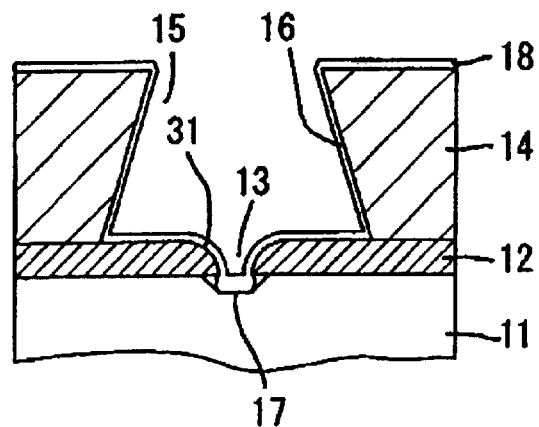
FIG. 3B (2)
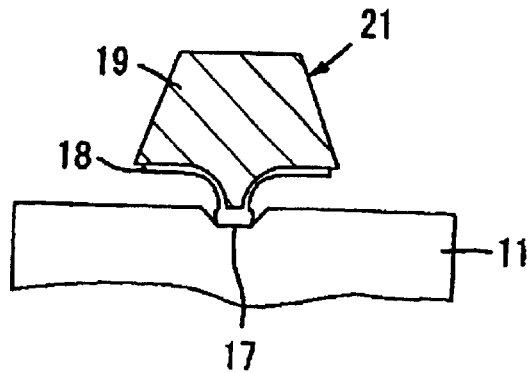
FIG. 3C (3)

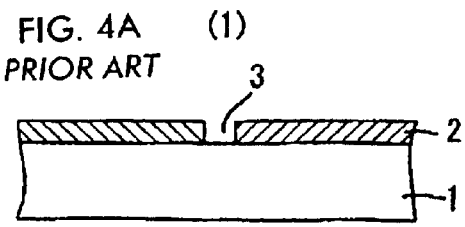
FIG. 4A (1) PRIOR ART
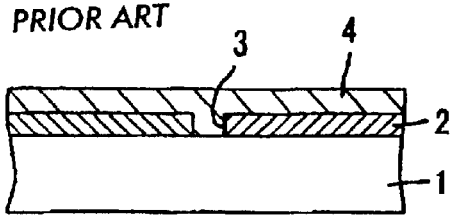
FIG. 4B (2) PRIOR ART
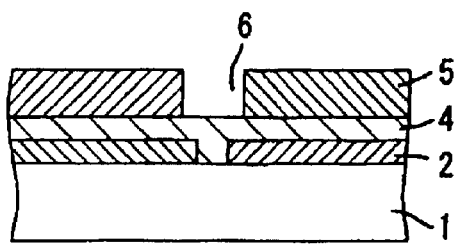
FIG. 4C (3) PRIOR ART
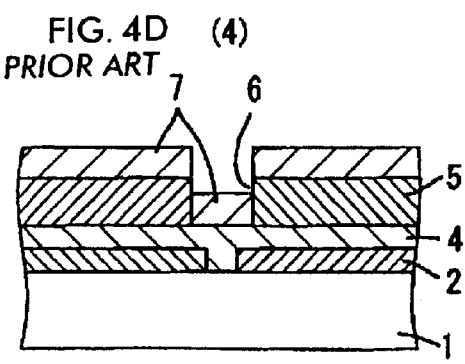
FIG. 4D (4) PRIOR ART
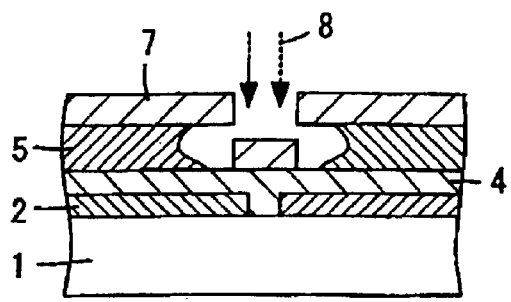
FIG. 4E (5) PRIOR ART
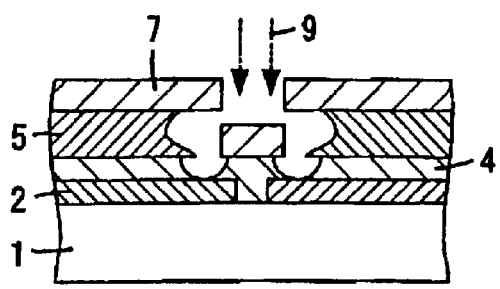
FIG. 4F (6) PRIOR ART
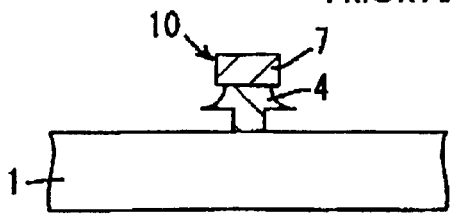
FIG. 4G (7) PRIOR ART

ELECTRODE FORMING METHOD AND FIELD EFFECT TRANSISTOR

BACKGROUND OF THE INVENTION

1. Field of the Invention

This invention relates to an electrode forming method and a field effect transistor having a gate electrode formed by the method, and more particularly, to a method for forming a microelectrode.

2. Description of the Related Art

Japanese Unexamined Patent Application Publication No. 8-115923 discloses a conventional method, which is relevant to the present invention, for fabricating a field effect transistor, and in particular, a method for forming a gate electrode. FIGS. 4A to 4G are cross-sectional views schematically illustrating a sequence of typical process steps included in the gate-electrode-forming method disclosed in the publication.

As shown in FIG. 4A, a first resist layer 2 is formed on a semiconductor substrate 1, and is patterned so as to form a first opening 3.

Next, as shown in FIG. 4B, a first conductor layer 4, which contains a high-melting-point metal, such as WSi, is formed by sputtering so as to cover the first resist layer 2.

Subsequently, as shown in FIG. 4C, a second resist layer 5 is formed so as to cover the first conductor layer 4, and is patterned so as to form a second opening 6. The second opening 6 has an area larger than the first opening 3 described above.

Next, as shown in FIG. 4D, a second conductor layer 7, which contains low-resistance metal, such as Au, is formed by electron beam deposition or the like. The second conductor layer 7 is formed on the second resist layer 5 as well as on the first conductor layer 4 in the second opening 6.

Thereafter, as shown in FIG. 4E, the second resist layer 5 is partially removed by etching with $O_2$ plasma 8, such that the conductor layer 4 is partially exposed.

Next, as shown in FIG. 4F, the first conductor layer 4 is partially removed by dry etching with $O_2/CF_4$ plasma 9. Consequently, a portion that provides a gate electrode 10 (see FIG. 4G) in the first conductor layer 4 is separated from the other portions.

Subsequently, as shown in FIG. 4G, the first resist layer 2, the first conductor layer 4 that lies thereon, the second resist layer 5, and the second conductor layer 7 are removed by a lift-off process. As a result, the gate electrode 10 remains on the semiconductor substrate 11.

The above-described method for forming the gate electrode 10 shown in FIGS. 4A to 4G employs a lift-off process for removing the first resist layer 2. In general, to accomplish a lift-off process in appropriate processing time for an industrial purpose, the thickness of the resist layer needs to be at least about several hundred nm, and preferably, about 1 $\mu$m or more.

Meanwhile, to improve the operational speed of a field effect transistor, the gate length must be reduced; in particular, a field effect transistor for use in a millimeter wave band needs to have a gate length of 0.1 $\mu$m or less.

In such a known method, for example, in the formation of the gate electrode 10 having a gate length of 0.1 $\mu$m using the conventional method shown in FIGS. 4A to 4G, when the thickness of the first resist layer 2 is set to 500 nm in consideration of an industrially reliable lift-off process, the cross-sectional shape of the first opening 3, shown in FIG. 4A, inevitably becomes a groove that is significantly narrow and deep, as shown in FIG. 5A.

Thus, when the process illustrated in FIG. 4B is performed to deposit a metal thin film that provides the first conductor layer 4, the width of the first opening 3 decreases, as shown in FIG. 5B, as the metal thin film is deposited, thereby causing "constriction" to occur. This makes it difficult to provide sufficient thickness necessary for the first conductor layer 1 within the first opening 3.

Another possible approach is, as shown in FIG. 6, to heat-treat the first resist layer 2 at a temperature of 200° C. such that the edges of the open end of the first opening 3 are thermally deformed and chamfered. Such a process can increase the width of the open end of the first opening 3, which thus can overcome the problem illustrated in FIG. 5B.

With such an approach, however, the resist contained in the first resist layer 2 hardens, which makes it significantly more difficult to perform a subsequent lift-off process.

Accordingly, while the conventional method illustrated in FIGS. 4A to 4G can be applied to the formation of the gate electrode 10 having a gate length of, for example, about 0.5 $\mu$m, which is used in a microwave band or the like, it is difficult to apply the conventional method to the formation of the gate electrode 10 having a gate length of 0.1 $\mu$m or sub-0.1 $\mu$m which is suitable for millimeter wave bands.

While the above description has been given for the formation of a gate electrode for a field effect transistor, the same method is generally applicable to the formation of any electrode that has a structure with at least two layers and that involves micro wiring in other semiconductor devices or electronic components.

SUMMARY OF THE INVENTION

Accordingly, the present invention provides an electrode forming method and a field effect transistor having a gate electrode formed by the method, which can overcome the foregoing problems.

The present invention is first directed to a method for forming on a substrate an electrode having a structure with at least two layers. To overcome the above-described technical difficulties, the method for forming the electrode according to the present invention has the following configuration.

That is, a first aspect of the present invention provides a method for forming on a substrate an electrode having a structure with at least two layers. The method includes a first step of forming a first resist layer, which has a first opening therein, on the substrate; a second step of forming a second resist layer on the first resist layer; and a third step of forming a second opening in the second resist layer. The second opening has a larger area than the first opening and is located in the vicinity of the first opening. The method further includes a fourth step of forming a first conductor layer on the inner surfaces of the first and second openings and on surfaces of the first and second resist layers, a fifth step of forming a second conductor layer on the first conductor layer in a region other than the inner peripheral surface of the second opening. The method further includes a sixth step of removing, by etching, the first conductor layer that lies at a portion that is not covered by the second conductor layer within the second opening; a seventh step of removing, by a lift-off process, the second resist layer and the first and second conductor layers which are above the second resist layer; and an eighth step of removing the first resist layer by ashing.

More specifically, the method according to the first aspect of the present invention has the following variations.

Advantageously, in the first step, the first opening may be formed in the first resist layer by using a photolithography technique.

Advantageously, in the third step, the second opening may be formed in the second resist layer by using a photolithography technique.

Advantageously, in the third step, the second opening may be formed to have an inverted-tapered shape in cross-section. With this arrangement, it is possible to prevent the second conductor layer from being formed on the inner peripheral surface of the second opening. Thus, in the sixth step of removing the first conductor layer within the second opening by etching, it is possible to prevent the second layer from interrupting the removal of the first conductor layer.

In the fourth step, the first conductor layer may be formed by sputtering.

Advantageously, in the fifth step, the second conductor layer may be formed by deposition.

Advantageously, in the sixth step, the first conductor layer may be removed by plasma etching with a gas mixture of $CF_4$ or $CHF_3$ and oxygen.

The first conductor layer may be formed by sputtering in the fourth step, the second conductor layer may be formed by deposition in the fifth step, and the first conductor layer may be removed by dry etching in the sixth step. In this case, these steps can be sequentially performed without using a photolithographic process, thus improving the efficiency of the steps.

In addition, advantageously, the fourth and fifth steps or the fourth, fifth, and sixth steps may be sequentially performed using a multi-chamber vacuum apparatus. In this case, it is possible to perform the steps in a vacuum. This can further improve the process efficiency and can easily keep the interface between the first conductor layer and the second conductor layer clean.

Advantageously, the first resist layer may be formed to have a thickness less than the second resist layer.

Advantageously, the method further may include a step of heat-treating the first resist layer between the first and second steps, such that the edge of the open end of the first opening is thermally deformed and chamfered.

With this arrangement, when the first conductor layer is formed, metal contained in the first conductor layer can be easily introduced into the first opening. Thus, the opening length of the first opening can be further reduced. As a result, it is possible to reduce the width of the electrode to be formed on the substrate.

Advantageously, the method according to the first aspect of the present invention may be used to form a gate electrode for a field effect transistor. In this case, the electrode is a gate electrode and the substrate is a semiconductor substrate.

According to the present invention, as described in the first aspect of the present invention, the first resist layer having the first opening, which defines the width of the electrode (the gate length in the case of a gate electrode) is removed by ashing rather than a lift-off process. Thus, not only is there no effect on a temperature for processing the first resist layer, but also the thickness of the first resist layer is not affected by limitations that allow for a lift off process. Consequently, the thickness of the first resist layer can be reduced without considering a lift-off process. Thus, even when the opening length of the first opening is reduced, it is possible to easily form the first conductor layer in the first opening as well. As a result, the width of the formed electrode (the gate length in the case of the gate electrode) can be sufficiently reduced to meet requirements for miniaturization.

In addition, according to the present invention, before the second resist layer is removed by a lift-off process, the first conductor layer within the second opening, which is formed in the second resist layer, is removed by etching. Thus, it is possible to easily remove the second resist layer by a lift-off process. Since the thickness of the second resist layer has no direct influence on the width of the electrode (i.e., the gate length in the case of the gate electrode) on the substrate, thus the thickness of the second resist layer can be selected by considering the ease of a lift-off process.

Thus, when the present invention is applied to the formation of the gate electrode of a field effect transistor, it is possible to provide a field effect transistor that can achieve a gate length of 0.1 $\mu$m or less, that can provide a high-speed operation and a high gain characteristic, and that can be used even in a millimeter wave band.

The method for forming a gate electrode for a field effect transistor has the following variations.

Preferably, the first conductor layer contains a high-melting-point metal. With this arrangement, the gate electrode can be formed to sustain high power, which is advantageous in fabricating a power field effect transistor.

Preferably, the second conductor layer has a multilayer structure, and the layers each contain metal and at least one of the layers contains gold.

A second aspect of the present invention provides a field effect transistor. The field effect transistor includes the gate electrode formed by the method described above.

BRIEF DESCRIPTION OF THE DRAWINGS

FIG. 2 is a cross-sectional view schematically illustrating the configuration of a field effect transistor;

FIGS. 3A to 3C are cross-sectional views schematically illustrating distinctive processes included in a method for forming a gate electrode for a field effect transistor, according to a second embodiment of the present invention;

FIGS. 4A to 4G are cross-sectional views schematically illustrating a sequence of typical process steps included in a known method of forming a gate electrode for a field effect transistor;

DESCRIPTION OF THE EMBODIMENTS OF THE INVENTION

FIGS. 1A to 1H illustrate a method for forming a field effect transistor, according to a first embodiment of the present invention.

Figure 1A:
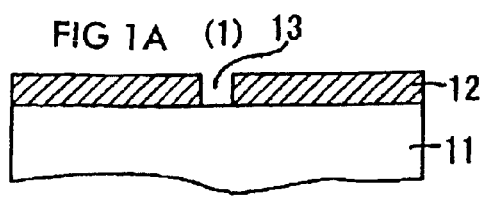
FIGS. 1A to 1H are cross-sectional views schematically illustrating a sequence of typical processes included in a method for forming a gate electrode for a field effect transistor according to a first embodiment of the present invention.

First, as shown in FIG. 1A, a semiconductor substrate 11 is prepared. Source, drain, and gate regions, and the like, which are not shown, are formed on the semiconductor substrate 11 by a typical semiconductor fabrication process. The semiconductor substrate 11 is, for example, a GaAs or InP substrate, and an active layer portion, which provides the gate region, is formed by an epitaxial method, such as ion-implanting, MBE (molecular beam epitaxy), or MOCVD (metal organic chemical vapor deposition). The epitaxial layer preferably has a heterojunction structure, including a combination of mixed crystal materials, such as AlGaAs, InGaAs, InAlAs, and InGaP.

Subsequently, as shown in FIG. 1A, a first resist layer 12 is formed on the semiconductor substrate 11. A negative resist is used for the first resist layer 12, and the thickness thereof is, for example, 200 nm.

A first opening 13 is formed in the first resist layer 12. The first opening 13 can be formed by, for example, a method disclosed in Japanese Unexamined Patent Application Publication No. 10-98178. Thus, the first opening 13 can be obtained by removing a dummy gate, which is formed using a phase shift mask, and the opening length of the opening 13 is about 0.10 to 0.15 $\mu$m.

The first opening 13 defines a region of a gate-electrode region that is in contact with a surface of the semiconductor substrate 11, as will become apparent from the description below. The first resist layer 12 is removed by ashing, as described later, and thus is not limited in thickness, which otherwise would have had to be taken into account for a lift-off process. Thus, when the thickness of the first resist layer 12 is further reduced and even when the opening length of the first opening 13 is reduced, it is still possible to form a suitable first conductor layer, which will be performed in a subsequent process, in the opening 13. Thus, this method offers great versatility in further miniaturizing the gate length of the gate electrode to, for example, sub-0.1 $\mu$m.

Figure 1B:
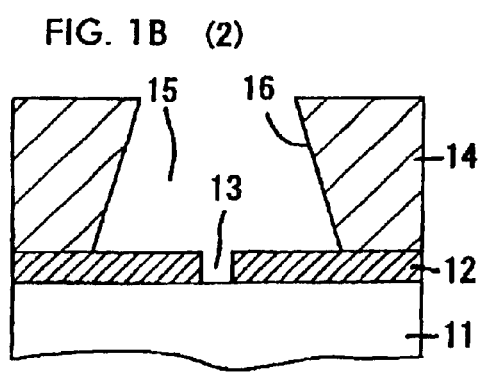

Next, as shown in FIG. 1B, a second resist layer 14 is formed on the first resist layer 12. A positive resist is used for the second resist layer 14. The thickness of the second resist layer 14 is, for example, about 1.2 $\mu$m, for facilitating a subsequent lift-off process.

Thereafter, as shown in FIG. 1B, a second opening 15, which has a larger area than the first opening 13, is formed in the second resist layer 14 in the vicinity of the region where the first opening 13 is located, by using a photolithography technique, which involves an exposure and processing procedure. The opening length of the upper open end of the second opening 15 is about 1.0 $\mu$m, and the opening 15 has an inverted-tapered shape whose cross-section diverges downward. In this manner, forming the second opening 15 to have an inverted-tapered shape can prevent metal for a second conductor layer, which is subsequently formed, from adhering to the inner peripheral surface 16 of the second opening 15.

Figure 1C:
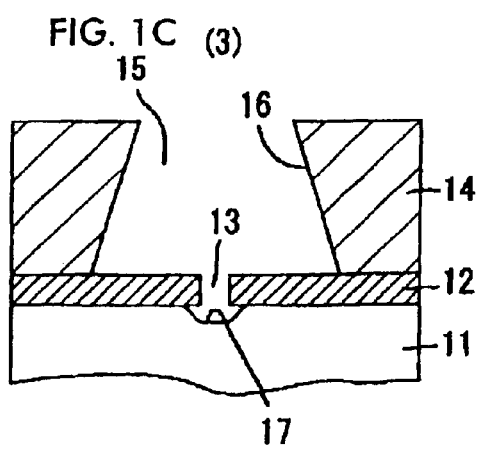

Next, as shown in FIG. 1C, the resulting structure is subjected to wet etching using an etching liquid containing phosphoric acid or citric acid, thereby etching the surface of the semiconductor substrate 11 that is exposed to the first opening 13 to provide a recess 17.

Figure 1D:
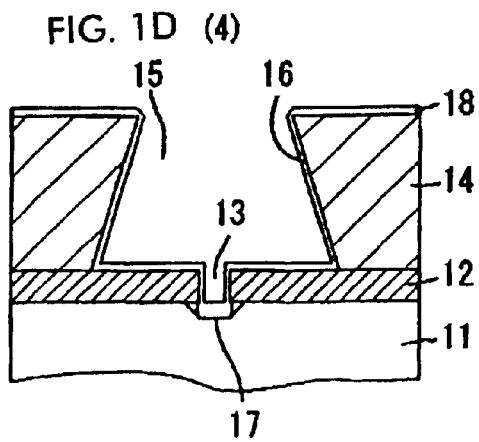

Thereafter, as shown in FIG. 1D, a first conductor layer 18 is formed on the inner surfaces of the first and second openings 13 and 15 and on surfaces of the first and second resist layers 12 and 14. The first conductor layer 18 provides the semiconductor substrate 11 with a Schottky contact, and is formed of a high-melting-point metal, such as WSi.

The first conductor layer 18 is formed by sputtering. For example, the first conductor layer 18, which contains WSi, is deposited by sputtering in Ar gas (at a pressure of 0.2 Pa), so as to have a thickness of about 60 nm. As described above, since the first conductor layer 18 is formed by sputtering, it is adhered on the inner surface of the first opening 13 and also on the inner peripheral surface 16 of the relatively large second opening 15. It also adheres to the recess 17.

With the first conductor layer 18 being adhered on the inner peripheral surface 16 of the second opening 15, as described above, it is difficult to use a lift-off process for the second resist layer 14. Thus, as described later, the first conductor layer 18 adhered on the inner peripheral surface 16 is removed in a subsequent process.

Figure 1E:
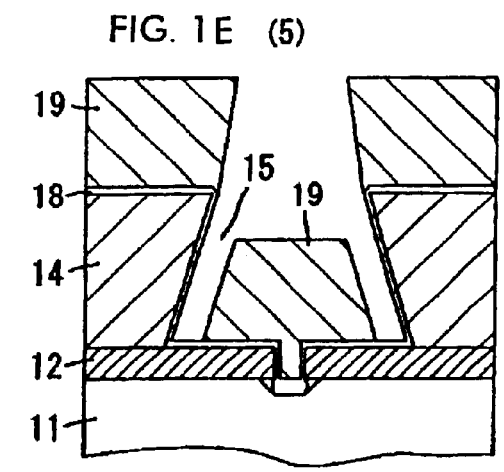

Next, the structure that has undergone the process illustrated in FIG. 1D is taken out from the sputtering apparatus, and is immediately introduced into a vacuum deposition apparatus, thereby forming second conductor layers 19, as shown in FIG. 1E, on the first conductor layer 18, including in the second opening 15. In this case, the use of a multi-chamber vacuum apparatus allows the formation of the second conductor layers 19 without exposing the structure to air, thus making it possible to keep the interface between the first conductor layer 18 and the second conductor layers 19 clean.

The second conductor layers 19 are formed by deposition, more preferably, electron-beam deposition. In this case, since the second opening 15 has an inverted-tapered cross-section as described above, it is possible to advantageously prevent the second conductor layer 19 from adhering to the inner peripheral surface 16 of the second opening 15.

The second conductor layers 19 is formed of low-resistance metal. In this case, to prevent interdiffusion, the second conductor layer 19 is preferably formed by sequentially depositing a layer containing Ti, a layer containing Pt, and a layer containing Au, which are not shown in FIG. 1E. For example, the individual layers constituting the multi-layer structure are formed such that the Ti layer is 20 nm in thickness, the Pt layer is 25 nm, and the Au layer is 450 nm.

Figure 1F:
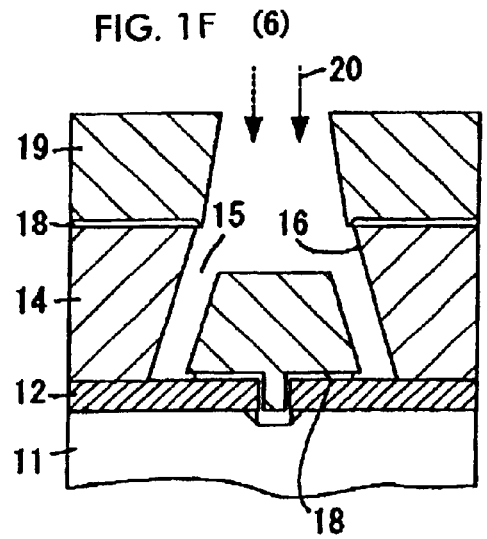

Thereafter, as shown in FIG. 1F, the first conductor layer 18 that lies at a portion within the second opening 15 that is not covered by the second conductor layer 19 is removed by etching with a plasma 20. This etching process may be performed, for example, by taking the structure that has undergone the process shown in FIG. 1E out from the vacuum deposition apparatus and directly introducing it into an apparatus for a dry etching process. More preferably, the use of a multi-chamber vacuum apparatus can enhance the efficiency of the process. This is because the apparatus requires a considerably short time for vacuum exhaustion until the etching process is made possible.

For example, an ICP (inductively coupled plasma) etcher capable of performing isotropic etching at a high rate is used to perform an etching process for 30 seconds with plasma 20 of a gas mixture of $CF_4$ or $CHF_3$ and oxygen (at a pressure of 8 Pa), thereby allowing the removal of the first conductor layer 18 within the second opening 15.

Figure 1G:
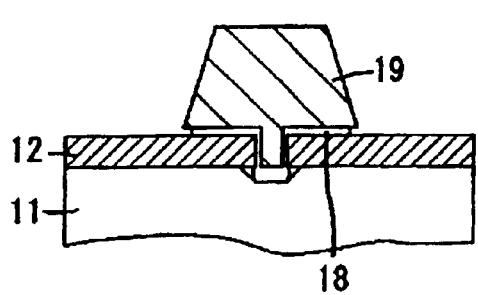

Next, the structure shown in FIG. 1F is immersed in an organic solvent and is subjected to a lift-off process. This removes, as shown in FIG. 1G, the second resist layer 14 as well as the unwanted first and second conductor layers 18 and 19 lying thereabove. Such a lift-off process can easily and reliably be done since the second resist layer 14 has enough thickness and the inner peripheral surface 16 of the second opening 15 is not covered by the first conductor layer 18, as shown in FIG. 1F.

Figure 1H:
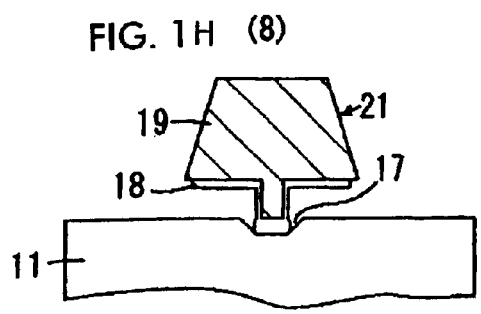
Figure 5A:
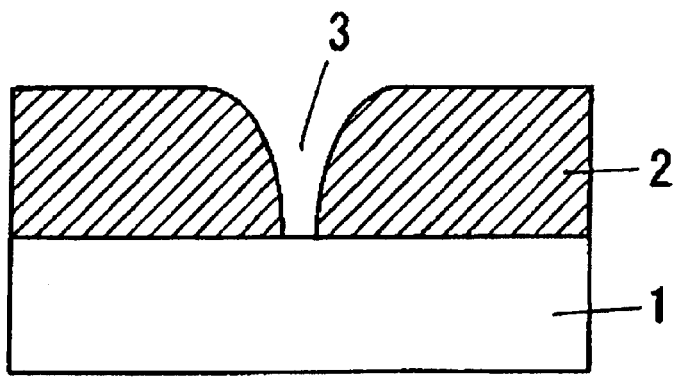
FIGS. 5A and 5B are enlarged cross-sectional views illustrating the vicinity of a first opening in a first resist layer shown in FIG. 4A, which illustrates a problem to be overcome by the present invention.
Figure 5B:
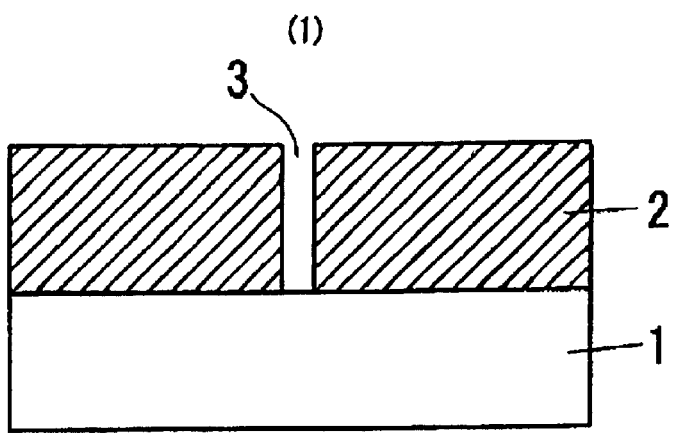
Figure 6:
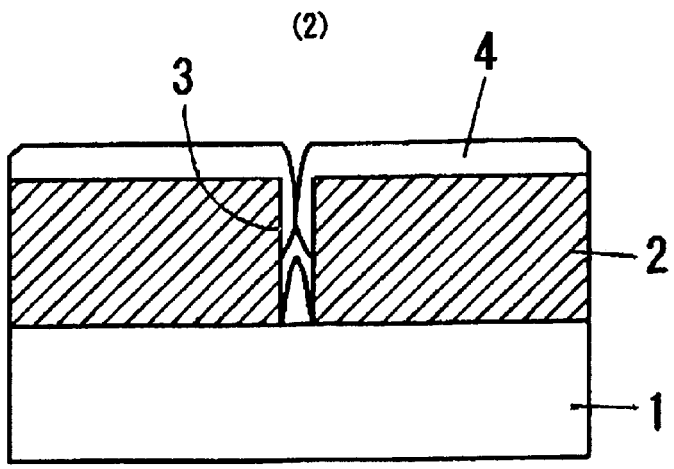
FIG. 6 is a cross-sectional view, which corresponds to FIGS. 5A and 5B, illustrating another problem to be overcome by the present invention.

Next, the first resist layer 12 is removed by ashing, thereby providing a structure with a gate electrode 21 remaining on the semiconductor substrate 11, as shown in FIG. 1H.

As described above, after the gate electrode 21 is formed, a protection film, an electrode pad for electrical connection, and wiring are formed to complete a field effect transistor.

FIG. 2 schematically illustrates a field effect transistor 25, which is provided in the above manner. In FIG. 2, elements corresponding to the elements shown in FIGS. 1A to 1H are denoted with the same reference numerals and the descriptions thereof are omitted.

The field effect transistor 25 is structured such that a gate electrode 21 as described above, a source electrode 26, and a drain electrode 27 are formed on a semiconductor substrate 11. In general, the source electrode 26 and the drain electrode 27 are formed on the semiconductor substrate 11 before the processes described and shown in FIGS. 1A to 1H are performed. The electrodes 26 and 27, however, may be formed after the gate electrode 21 is formed.

FIGS. 3A to 3C illustrate a method for forming a gate electrode for a field effect transistor, according to a second embodiment of the present invention. FIGS. 3A to 3C illustrate processes that are distinct from those in the first embodiment shown in FIGS. 1A to 1H. FIG. 3A corresponds to FIG. 1A, FIG. 3B corresponds to FIG. 1D, and FIG. 3C corresponds to FIG. 1H.

In FIGS. 3A to 3C, elements corresponding to the elements shown in FIGS. 1A to 1H are denoted with the same reference numerals and the descriptions thereof are omitted. A description will now be made of only distinctive processes in the second embodiment shown in FIGS. 3A to 3C.

First, as shown in FIG. 3A, a first resist layer 12 is formed on a semiconductor substrate 11, and a first opening 13 is formed therein. Thereafter, the first resist layer 12 is heat-treated at a temperature of, for example, about 200° C., such that the edge of the open end of the first opening 13 is thermally deformed, thereby forming a chamfer 31.

As a result of such heat treatment of the first resist layer 12, the resist contained in the first resist layer 12 may harden. Such hardening, however, does not cause any problem, since the first resist layer 12 is removed by ashing rather than a lift-off process, as described above.

The heat treatment of the first resist layer 12 is preferably performed before the second resist layer 14 is formed. This is because heat treatment after the second resist layer 14 is formed can cause the hardening of the second resist layer 14, which makes it difficult to remove the second resist layer 14 by a lift-off process.

FIG. 3B illustrates a state in which a first conductor layer 18 is formed. In the formation of the first conductor layer 18, sputtering is used as described above. In this case, since the open end, where the chamfer 31 is formed, of the upper portion of the first opening 13 is broadened, the first conductor layer 18 can easily be formed in the first opening 13 as well, without causing a disconnection due to "constriction". Consequently, even when the opening length of the first opening 13 is reduced, the first conductor layer 18 can easily be formed in the opening 13 as well.

FIG. 3C illustrates a state in which a gate electrode 21 is formed on the semiconductor substrate 11. As described above, since the opening length of the first opening 13 can be reduced, the gate length of the gate electrode 21 can be further reduced.

Other configurations in the second embodiment shown in FIGS. 3A to 3C are substantially the same as in the first embodiment shown in FIGS. 1A to 1H.

In the above embodiments, while the method for forming an electrode according to the present invention has been applied to the formation of a gate electrode for a field effect transistor, the present invention is not limited thereto. Thus, the method can also be applied to the formation of microelectrodes, including micro wiring or micro contact holes, other than gate electrodes, for other semiconductor devices or electronic components.

What is claimed is:

1. A method for forming on a substrate an electrode having a structure with at least two layers, the method comprising:

a first step of forming a first resist layer on the substrate, the first resist layer having a first opening therein;

a second step of forming a second resist layer on the first resist layer;

a third step of forming a second opening in the second resist layer, the second opening having a larger area than the first opening and being located in the vicinity of the first opening;

a fourth step of forming a first conductor layer on inner peripheral surfaces of the first and second openings and on surfaces of the first and second resist layers;

a fifth step of forming a second conductor layer on the first conductor layer in a region other than the inner peripheral surface of the second opening;

a sixth step of removing, by etching, the first conductor layer that lies at a portion that is not covered by the second conductor layer within the second opening;

a seventh step of removing, by a lift-off process, the second resist layer and the first and second conductor layers which are above the second resist layer; and an eighth step of removing the first resist layer by ashing.

2. The method according to claim 1, wherein, in the first step, the first opening is formed in the first resist layer by photolithography.

3. The method according to claim 1 or 2, wherein, in the third step, the second opening is formed in the second resist layer by photolithography.

4. The method according to claim 1 or 2, wherein, in the third step, the second opening is formed to have an inverted-tapered cross-sectional shape.

5. The method according to claim 1 or 2, wherein, in the fourth step, the first conductor layer is formed by sputtering.

6. The method according to claim 1 or 2, wherein, in the fifth step, the second conductor layer is formed by deposition.

7. The method according to claim 1 or 2, wherein, in the sixth step, the first conductor layer is removed by plasma etching with a gas mixture of $CF_4$ or $CHF_3$ and oxygen.

8. The method according to claim 1 or 2, wherein the first conductor layer is formed by sputtering in the fourth step; the second conductor layer is formed by deposition in the fifth step; the first conductor layer is removed by dry etching in the sixth step; and the fourth and fifth steps are sequentially performed using a multi-chamber vacuum apparatus.

9. The method according to claim 8, wherein the sixth step is also performed with said multi-chamber vacuum apparatus.

10. The method according to claim 1 or 2, wherein the first resist layer is formed to have a thickness less than the second resist layer.

11. The method according to claim 1 or 2, further comprising a step of heat-treating the first resist layer between the first and second steps, such that the edge of the open end of the first opening is thermally deformed and chamfered.

12. The method according to claim 11, wherein said heat-treating step hardens the first resist layer.

13. The method according to claim 1 or 2, wherein the electrode is a gate electrode for a field effect transistor and the substrate is a semiconductor substrate.

14. The method according to claim 13, wherein the first conductor layer comprises a high-melting-point metal.

15. The method according to claim 13, wherein the second conductor layer has a multilayer structure, the layers each comprising metal and at least one of the layers comprising gold.

16. The method according to claim 1, further comprising an etching step which forms a recess in a portion of the substrate that is exposed to the first opening.

17. The method according to claim 16, wherein said fourth step further forms said first conductor layer in said recess.

* * * * *